United States Patent
Forbes et al.

(10) Patent No.: US 6,936,849 B1
(45) Date of Patent: *Aug. 30, 2005

(54) SILICON CARBIDE GATE TRANSISTOR

(75) Inventors: Leonard Forbes, Corvallis, OR (US); Kie Y. Ahn, Chappaqua, NY (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/903,486

(22) Filed: Jul. 29, 1997

(51) Int. Cl.[7] .................. H01L 31/0312; H01L 29/76
(52) U.S. Cl. .................. 257/77; 257/76; 257/351; 257/412; 257/413; 438/931
(58) Field of Search .................. 257/76–77.351, 257/41, 2–413; 438/931

(56) References Cited

U.S. PATENT DOCUMENTS

| | | | |
|---|---|---|---|
| 3,792,465 A | 2/1974 | Collins et al. | 340/324 R |
| 4,113,515 A | 9/1978 | Kooi et al. | 148/1.5 |
| 4,118,795 A | 10/1978 | Frye et al. | 365/222 |

(Continued)

FOREIGN PATENT DOCUMENTS

| | | | | |
|---|---|---|---|---|
| EP | 0291951 | 11/1988 | | H01L/29/64 |
| EP | 0681333 | 8/1995 | | H01L/29/788 |
| JP | 57-126175 | 8/1982 | | H01L/31/04 |
| JP | 60-024678 | 2/1985 | | G06K/9/36 |
| JP | 60-184681 | 9/1985 | | C23C/16/30 |
| JP | 60-242678 | 12/1985 | | H01L/29/73 |
| JP | 62-122275 | 6/1987 | | H01L/27/78 |
| JP | 63-181473 | 7/1988 | | H01L/29/78 |
| JP | 63-219172 | 9/1988 | | H01L/29/78 |
| JP | 63-289960 | 11/1988 | * | |
| JP | 01-115162 | 5/1989 | | H01L/29/78 |
| JP | 2203564 | 8/1990 | | H01L/29/46 |
| JP | 3-222367 | 10/1991 | | H01L/29/784 |
| JP | 04-056769 | 2/1992 | | C23C/16/32 |
| JP | 6-224431 | 8/1994 | | H01L/29/784 |
| JP | 6-302828 | 10/1994 | | H01L/29/788 |
| JP | 07-115191 | 5/1995 | * | |
| JP | 07-226507 | 8/1995 | | H01L/29/78 |
| JP | 8-255878 | 10/1996 | | H01L/27/10 |
| JP | 08-255878 TR | 10/1996 | | H01L/27/10 |

OTHER PUBLICATIONS

Demichelis et al., "Influence of Doping on the Structural and Optoelectronic Properties of Amorphous and Microcrystalline Silicon Carbide", *J. Appl. Phys*, 72 (4) Aug. 15, 1992, pp. 1327–1333.*

(Continued)

*Primary Examiner*—Donghee Kang
(74) *Attorney, Agent, or Firm*—Schwegman, Lundberg, Woessner & Kluth, P.A.

(57) ABSTRACT

A field-effect transistor (FET) device and method of fabrication uses an electrically interconnected polycrystalline or microcrystalline silicon carbide (SiC) gate having a lower electron affinity and higher work function than a polysilicon gate FET. The smaller threshold voltage magnitude of the SiC gate FET allows reduced power supply voltages (lowering power consumption and facilitating downward scaling of transistor dimensions), and enables higher switching speeds and improved performance. The smaller threshold voltage magnitudes are obtained without ion-implantation, which is particularly useful for SOI and thin film transistor devices. Threshold voltage magnitudes are stable in spite of subsequent thermal processing steps. N-channel threshold voltages are optimized for enhancement mode.

44 Claims, 5 Drawing Sheets

U.S. PATENT DOCUMENTS

| | | | |
|---|---|---|---|
| 4,384,349 A | 5/1983 | McElroy | 365/185.02 |
| 4,460,670 A | 7/1984 | Ogawa et al. | 430/57 |
| 4,462,150 A | 7/1984 | Nishimura et al. | 29/576 B |
| 4,473,836 A | 9/1984 | Chamberlain | 357/30 |
| 4,507,673 A | 3/1985 | Aoyama et al. | 357/23 R |
| 4,598,305 A | 7/1986 | Chiang et al. | 357/23.7 |
| 4,657,699 A | 4/1987 | Nair | 252/513 |
| 4,736,317 A * | 4/1988 | Hu et al. | 364/200 |
| 4,738,729 A | 4/1988 | Yoshida et al. | 136/258 |
| 4,768,072 A | 8/1988 | Seki et al. | 357/29 |
| 4,769,686 A | 9/1988 | Horiuchi et al. | 357/23.8 |
| 4,816,883 A | 3/1989 | Baldi | 357/23.5 |
| 4,841,349 A | 6/1989 | Nakano | 357/30 |
| 4,849,797 A | 7/1989 | Ukai et al. | 357/237 |
| 4,893,273 A | 1/1990 | Usami | 365/185 |
| 4,897,710 A | 1/1990 | Suzuki et al. | 357/71 |
| 4,980,303 A | 12/1990 | Yamauchi | 437/31 |
| 4,994,401 A | 2/1991 | Ukai | 437/40 |
| 5,049,950 A | 9/1991 | Fujii et al. | 357/2 |
| 5,111,430 A | 5/1992 | Morie | 365/185 |
| 5,145,741 A | 9/1992 | Quick | 428/402 |
| 5,189,504 A | 2/1993 | Nakayama et al. | 257/422 |
| 5,235,195 A | 8/1993 | Tran et al. | 257/59 |
| 5,260,593 A | 11/1993 | Lee | 257/316 |
| 5,293,560 A | 3/1994 | Harari | 365/185 |
| 5,298,796 A | 3/1994 | Tawel | 307/201 |
| 5,317,535 A | 5/1994 | Talreja et al. | 365/185 |
| 5,336,361 A | 8/1994 | Tamura et al. | 438/767 |
| 5,360,491 A | 11/1994 | Carey et al. | 136/256 |
| 5,366,713 A | 11/1994 | Sichanugrist et al. | 423/346 |
| 5,367,306 A * | 11/1994 | Hollon et al. | 365/185.2 |
| 5,369,040 A * | 11/1994 | Halvis et al. | 437/3 |
| 5,371,383 A | 12/1994 | Miyata et al. | 257/77 |
| 5,388,069 A | 2/1995 | Kokubo | 365/185 |
| 5,393,999 A | 2/1995 | Malhi | 257/289 |
| 5,407,845 A | 4/1995 | Nasu et al. | 437/40 |
| 5,409,501 A | 4/1995 | Zauns-Huber et al. | 8/94.29 |
| 5,415,126 A | 5/1995 | Loboda et al. | 117/88 |
| 5,424,993 A | 6/1995 | Lee et al. | 365/218 |
| 5,425,860 A | 6/1995 | Truher et al. | 204/192.23 |
| 5,438,544 A | 8/1995 | Makino | 365/185 |
| 5,441,901 A | 8/1995 | Candelaria | 437/31 |
| 5,449,941 A | 9/1995 | Yamazaki et al. | 257/411 |
| 5,455,432 A * | 10/1995 | Hartsell et al. | 257/77 |
| 5,465,249 A | 11/1995 | Cooper et al. | 365/149 |
| 5,467,306 A | 11/1995 | Kaya et al. | 365/185.2 |
| 5,477,485 A | 12/1995 | Bergemont et al. | 365/185.24 |
| 5,493,140 A | 2/1996 | Iguchi | 257/316 |
| 5,508,543 A | 4/1996 | Hartstein et al. | 257/314 |
| 5,530,581 A | 6/1996 | Cogan | 359/265 |
| 5,557,114 A | 9/1996 | Leas et al. | 257/59 |
| 5,557,122 A | 9/1996 | Shrivastava et al. | 257/309 |
| 5,562,769 A | 10/1996 | Dreifus et al. | 117/86 |
| 5,580,380 A | 12/1996 | Liu et al. | 117/86 |
| 5,604,357 A | 2/1997 | Hori | 257/24 |
| 5,623,160 A | 4/1997 | Liberkowski | 257/621 |
| 5,623,442 A | 4/1997 | Gotou et al. | 365/185.08 |
| 5,629,222 A | 5/1997 | Yamazaki et al. | 438/259 |
| 5,654,208 A | 8/1997 | Harris et al. | 438/522 |
| 5,661,312 A | 8/1997 | Weitzel et al. | 257/77 |
| 5,670,790 A | 9/1997 | Katoh et al. | 257/14 |
| 5,672,889 A | 9/1997 | Brown | 257/77 |
| 5,698,869 A | 12/1997 | Yoshimi et al. | 257/192 |
| 5,714,766 A | 2/1998 | Chen et al. | 257/20 |
| 5,719,410 A | 2/1998 | Suehiro et al. | 257/77 |
| 5,734,181 A | 3/1998 | Ohba et al. | 257/77 |
| 5,740,104 A | 4/1998 | Forbes | 365/185.03 |
| 5,754,477 A | 5/1998 | Forbes | 365/185.33 |
| 5,786,250 A | 7/1998 | Wu et al. | 438/254 |
| 5,789,276 A | 8/1998 | Leas et al. | 438/59 |
| 5,798,548 A | 8/1998 | Fujiwara | 257/319 |
| 5,801,401 A | 9/1998 | Forbes | 257/77 |
| 5,808,336 A | 9/1998 | Miyawaki | 257/315 |
| 5,828,101 A | 10/1998 | Endo | 257/330 |
| 5,846,859 A | 12/1998 | Lee | 438/253 |
| 5,858,811 A | 1/1999 | Tohyama | 438/75 |
| 5,861,346 A | 1/1999 | Hamza et al. | 438/869 |
| 5,877,041 A | 3/1999 | Fuller | 438/105 |
| 5,886,368 A * | 3/1999 | Forbes et al. | 257/77 |
| 5,886,376 A | 3/1999 | Acovic et al. | 257/316 |
| 5,886,379 A | 3/1999 | Jeong | 257/319 |
| 5,898,197 A | 4/1999 | Fujiwara | 257/317 |
| 5,907,775 A | 5/1999 | Tseng | 438/261 |
| 5,912,837 A | 6/1999 | Lakhani | 365/185.02 |
| 5,926,740 A | 7/1999 | Forbes et al. | 438/763 |
| 5,976,926 A | 11/1999 | Wu et al. | 438/237 |
| 5,989,958 A | 11/1999 | Forbes | 438/257 |
| 5,990,531 A | 11/1999 | Taskar et al. | 257/410 |
| 6,018,166 A | 1/2000 | Lin et al. | 257/22 |
| 6,031,263 A | 2/2000 | Forbes et al. | 257/315 |
| 6,034,001 A | 3/2000 | Shor et al. | 438/931 |
| 6,075,259 A | 6/2000 | Baliga | 257/77 |
| 6,084,248 A | 7/2000 | Inoue | 257/66 |
| 6,093,937 A | 7/2000 | Yamazaki et al. | 257/59 |
| 6,099,574 A | 8/2000 | Fukuda et al. | 703/14 |
| 6,100,193 A | 8/2000 | Suehiro et al. | 438/685 |
| 6,130,147 A | 10/2000 | Major et al. | 438/604 |
| 6,144,581 A | 11/2000 | Diorio et al. | 365/185.03 |
| 6,163,066 A | 12/2000 | Forbes et al. | 257/632 |
| 6,166,401 A | 12/2000 | Forbes | 257/77 |
| 6,166,768 A | 12/2000 | Fossum et al. | 348/308 |
| 6,271,566 B1 | 8/2001 | Tsuchiaki | 257/347 |
| 6,297,521 B1 | 10/2001 | Forbes et al. | 438/763 |
| 6,307,775 B1 | 10/2001 | Forbes et al. | 365/185.01 |
| 6,309,907 B1 | 10/2001 | Forbes et al. | 438/108 |
| 6,365,919 B1 | 4/2002 | Tihanyi et al. | 257/77 |

OTHER PUBLICATIONS

U.S. Appl. No. 08/903,452, filed Jul. 29, 1997, Transistor with Variable Electron Affinity Gate and Methods of Fabrication and Use.

U.S. Appl. No. 09/256,643, filed Feb. 23, 1999, Transistor with Variable Electron Affinity Gate and Methods of Fabrication and Use.

U.S. Appl. No. 09/652,420, filed Aug. 31, 2000, Transistor with Variable Electron Affinity Gate and Methods of Fabrication and Use.

U.S. Appl. No. 09/691,004, filed Oct. 18, 2000, Transistor with Variable Electron Affinity Gate and Methods of Fabrication and Use.

U.S. Appl. No. 09/259,870, filed Mar. 1, 1999, Fabrication of Silicon Carbide Gate Transistor.

U.S. Appl. No. 08/902,132, filed Jul. 29, 1997, Transistor with Silicon Oxycarbide Gate and Methods of Fabrication and Use.

U.S. Appl. No. 09/138,294, filed Aug. 21, 1998, Transistor with Silicon Oxycarbide Gate and Methods of Fabrication and Use.

U.S. Appl. No. 08/902843, filed Jul. 29, 1997, Deaprom Having Amorphous Silicon Carbide Gate Insulator.

U.S. Appl. No. 09/135,413, filed Aug. 14, 1998, Method for Operating a Memory Device Having an Amorphous Silicon Carbide Gate Insulator.

U.S. Appl. No. 09/134,713, filed Aug. 14, 1998, Deaprom Having Amorphous Silicon Carbide Gate Insulator.

U.S. Appl. No. 08/902,098, filed Jul. 29, 1997, Deaprom and Transistor with Gallium Nitride or Gallium Aluminum Nitride Gate.

U.S. Appl. No. 09/140,978, filed Aug. 27, 1998, Deaprom and Transistor with Gallium Nitride or Gallium Aluminum Nitride Gate.

U.S. Appl. No. 09/141,392, filed Aug. 27, 1998, Deaprom and Transistor with Gallium Nitride or Gallium Aluminum Nitride Gate.

U.S. Appl. No. 09/883,795, filed Jun. 18, 2001, Method of Forming a Device with a Gallium Nitride or Gallium Aluminum Nitride Gate.

U.S. Appl. No. 10/047,181, filed Oct. 23, 2001, Memory Device with Gallium Nitride or Gallium Aluminum Nitride Gate.

U.S. Appl. No. 08/902,133, filed Jul. 29, 1997, Memory Device.

U.S. Appl. No. 10/231,687, filed Aug. 29, 2002, Memory Device.

U.S. Appl. No. 08/903,453, filed Jul. 29, 1997, Carburized Silicon Gate Insulators for Integrated Circuits.

U.S. Appl. No. 09/258,467, filed Feb. 26, 1999, Carburized Silicon Gate Insulators for Integrated Circuits.

U.S. Appl. No. 09/650,553, filed Aug. 30, 2000, Carburized Silicon Gate Insulators for Integrated Circuits.

U.S. Appl. No. 10/461,593, filed Jun. 11, 2003, Memory Device.

U.S. Appl. No. 10/789,203, filed Feb. 27, 2004, Operating a Memory Device.

Beltram, F., et al., "GaAlAs/GaAs Floating–Gate Memory Devices with Grade–Gap Injector Grown by Molecular–Beam Epitaxy", *IEEE Transactions on Electron Devices, 35*, Abstract No. VA–7, (Dec. 1988), 2451.

Beltram, F., et al., "Memory phenomena in heterojunction structures: Evidence for suppressed thermionic emission", *Appl. Phys. Lett., 53(5)*, (1988), pp. 376–378.

Boeringer, Daniel W., et al., "Avalanche amplification of multiple resonant tunneling through parallel silicon microcrystallites", *Physical Rev. B, 51*, (1995), 13337–13343.

Edelberge, E., et al., "Visible Luminescence from Nanocrystalline silicon films produced by plasma enhanced chemical vapor deposition", *Appl. Phys. Lett., 68*, (1996), 1415–1417.

Hybertsen, Mark S., "Absorption and Emission of Light in Nanoscale Silicon Structures", *Phys. Rev. Lett., 72*, (1994), 1514–1517.

Kato, Masataka, et al., "Read–Disturb Degradation Mechanism due to Electron Trapping in the Tunnel Oxide for Low–voltage Flash Memories", *IEEE Electron Device Meeting*, (1994), 45–48.

Lin, B., et al., "Dramatic Reduction of Sidegating in MODFET's", *IEEE Transactions on Electron Devices, 35*, Abstract No. VA–6,(1988),p. 2451.

Lott, J., et al., "Anisotropic thermionic emission of electrons contained in GaAs/AlAs floating gate devices structures", *Appl. Phys. Lett., 55(12)*, (1989),pp. 1226–1228.

Lott, J. A., et al., "Charge Storage in InAlAs/InGaAs/InP Floating Gate Heterostructures", *Electronics Letters, 26*, (Jul. 5, 1990),972–973.

Mohammad, S. N., et al., "Emerging Galium Nitride Based Devices", *Proceedings of the IEEE, 83*, (Oct. 1995), 1306–1355.

Nakamura, J., et al., "CMOS Active Pixel Image Sensor with Simple Floating Gate Pixels", *IEEE Transactions on Electron Devices, 42*, (1995), 1693–1694.

Neudeck, P., et al., "Electrical Characterization of a JFET–Accessed GaAs Dynamic RAM Cell", *IEEE Electron Device Letters, 10(11)*, (1989), pp. 477–480.

Qian, Q., et al., "MultiDay Dynamic Storage of Holes at the AlAs/GaAs Interface", *IEEE Electron Device Letters, EDL–7(11)*, (1986),pp. 607–609.

Ruska, W. S., "Microelectronic Processing", *McGraw–Hill Book Co.*, (1987),281.

Schoenfeld, O., et al., "Formation of Si Quantum dots in Nanocrystalline silicon", *Proc. 7th Int. Conf. on Modulated Semiconductor Structures, Madrid*, (1995),605–608.

Sharma, B., et al., "Heterojunction Devices", *In: Semiconductor Heterojunctions*, Pergamon Press New York,(1974), pp. 133–137.

Streetman, B., *In: Solid State Electronic Devices, 4th Edition*, Prentice Hall, New Jersey,(1995),pp. 217–219, 392–394.

Sze, S. M., *In: Physics of Semiconductor Devices*, Wiley–Interscience, New York,(1969),p. 496–497.

Sze, S. M., *In: Physics of Semiconductor Devices. 2nd Edition*, John Wiley & Sons, New York,(1981),pp. 122–129, 700–703, 708–710,763–765.

Tsu, Raphael, et al., "Slow Conductance oscillations in nanoscale silicon clusters of quantum dots", *Appl. Phys. Lett., 65*, (1994),842–844.

Tsu, R., et al., "Tunneling in Nanoscale Silicon Particles Embedded in an a–SlO2 Matrix", *Abstract, IEEE Device Research Conference*, (1996),pp. 178–179.

Wolf, S., *Silicon Processing for the VLSI Era*, vol. 3, Lattice Press, Sunset Beach, CA,(1995),311–312.

Ye, Qiu–Yi, et al., "Resonant Tunneling via Microcrystalline–silicon quantum confinement", *Physical Rev. B, 44*, (1991), 1806–1811.

Zhao, X., et al., "Nanocrystalline Si: a material constructed by Si quantum dots", *1st Int. Conf. on Low Dimensional Structures and Devices, Singapore*, (1995),467–471.

Burns, S.G. ,et al., *In: Principles of Electronic Circuits*, West Publishing Co., St. Paul, MN,(1987),382–383.

Burns, S.,et al., *In: Principles of Electronic Circuits*, West Publishing Company,(1987),p. 380.

Capasso, F.,et al., "New Floating–Gate AlGaAs/GaAs Memory Devices with Graded–Gad Electron Injector and Long Retention Times", *IEEE Electron Device Letters*, (1988),pp. 377–379.

Ng, K., *In: Complete Guide To Semiconductor Devices*, McGraw–Hill, Inc. New York,(1995),pp. 322–328, 605–608.

Wolf, S., "Semiconductor Memory Process Integration", *Silicon Processing for The VLSI Era, vol. 2: Process Integration*, (1990),pp. 623–628.

Wolf, "Semiconductor Memory Process Integration", *Silicon Processing for the VLSI Era vol. 2: Process Integration*, Lattice Press, California, (1990), pp. 623–626.

Zirinsky, S., et al., "Electrical Resistivity of Amorphous Silicon Resistor Films", *Extented Abstracts of the Spring Meeting of the Electrochemical Society*, Washington, DC, pp. 147–149, (1971).

Sakata, I., et al., "Amorphous silicon/amorphous silicon carbide heterojunctions applied to memory device structures", *Electronics Letters*, vol. 30, No. 9, 688–689, (Apr. 28, 1994).

U.S. Appl. No. 09/259,870, filed Mar. 1, 1999, Silicon Carbide Gate Transistor and Fabrication Process.

U.S. Appl. No. 08/902,843, filed Jul. 29, 1997, Deaprom Having Amorphous Silicon Carbide Gate Insulator.

U.S. Appl. No. 09/135,413, filed Aug. 14, 1998, Method for Operating a Deaprom Having an Amorphous Silicon Carbide Gate Insulator.

U.S. Appl. No. 09/134,713, filed Aug. 14, 1998, Deaprom Having Amorphous Silicon Carbide Gate Insulator.

U.S. Appl. No. 08/903,452, filed Jul. 29, 1997, Transistor with Variable Electron Affinity Gate and Methods of Fabrication and Use.

U.S. Appl. No. 08/902,133, filed Jul. 29, 1997, Dynamic Electrically Alterable Programmable Read Only Memory Device.

U.S. Appl. No. 09/258,467, filed Feb. 26, 1999, Carburized Silicon Gate Insulators for Integrated Circuits.

Akasaki, I., et al., "Effects of AlN Buffer Layer on Crystallographic Structure and on Electrical and Optical Properties of GaN and Ga (1–x) Al (x) N [0<x (<or=) 0.4] Films Grown on Sapphire Substrate by MOVPE", *J, Crycstal Growth, 98*, 209–219, (1989).

Alok, D., et al., "Electrical Properties of Thermal Oxide Grown on N–type 6H–Silicon Carbide", *Applied Physcis Letters, 64*, 2845–2846, (May 23, 1994).

Andrieux, M., et al., "Interface and Adhesion of PACVD SiC Based Films on Metals", *Supp. Le Vide: science, technique et applications, 279*, 212–214, (1996).

Bachmann, P., et al., "Influence on Surface Modifications on the Electronic Properties of CVD Diamond Films", *Diamond and Related Materials, 5*, 1378–1383, (1996).

Baglee, D., "Characteristics & Reliability of 100 Angstrom Oxides", *IEEE 22nd Annual Proc.: Reliability Physics*, Las Vegas, 152–155, (Apr. 3–5, 1984).

Beheim, G., et al., "Magnetron Plasma Etching of SiC for Microstructures", *Proc: SPIE—Integrated Optics and Microstructures III*, San Jose, CA, 82–86, (Jan. 29, 1996).

Bengtsson, S., et al., "Applications of Aluminum Nitride Films Deposited by Reactive Sputtering to Silicon–On–Insulator Materials", *Japanese J. Applied Physics, 35*, 4175–4181, (1996).

Benjamin, M., et al., "UV Photoemission Study of Heteroepitaxial AlGaN Films Grown on 6H–SiC", *Applied Surface Science, 104/105*, 455–460, (1996).

Bermudez, V., et al., "The Growth and Properties of Al and AlN Films on GaN (0001)–(1×1)", *J. Applied Physics, 79*, 110–119, (Jan. 1996).

Casey, H., et al., "Low Interface Trap Density for Remote Plasma Deposited SiO2 on n–type GaN", *Applied Phys. Lett., 68*, 1850–1852, (Mar. 1996).

Chang, C., et al., "Novel Passivation Dielectrics—The Boron– or Phosphorus–Doped Hydrogenated Amorphous Silicon Carbide Films", *Journal of the Electrochemical Society, 132*, 418–422, (Feb. 1985).

Choi, J., et al., "Effect of Deposition Conditions and Pretreatments on the Microstructure of MPECVD Diamond Thin Films", *Materials Chemistry and Physics, 45*, 176–179, (1996).

Clarke, G., et al., "The Infrared Properties of Magnetron–Sputtered Diamond–Like Thin Films", *Thin Solid Films, 280*, 130–135, (1996).

Compagnini, G., et al., "Spectroscopic Characterization of Annealed Si (1–x) C (x) Films", *J. Materials Res., 11*, 2269–2273, (Sep. 1996).

Dartnell, N., et al., "Reactive Ion Etching of Silicon Carbide (Si (x) C (1–x))", *Vacuum, 46*, 349–355, (1995).

Demichelis, F., et al., "Influence of Doping on the Structural and Optoelectronic Properties of Amorphous and Microcrystalline Silicon Carbide", *Journal of Applied Physics, 72*, 1327–1333, (Aug. 15, 1992).

Demichelis, F., et al., "Physical Properties of Undoped and Doped Microcrystalline SiC:H Deposited By PECVD", *Materials Research Society Symposium Proceedings, 219*, Anaheim, CA, 413–418, (Apr. 30–May 3, 1991).

Dipert, B., et al., "Flash Memory Goes Mainstream", *IEEE Spectrum, 30*, 48–52, (1993).

Fissel, A., et al., "Epitaxial Growth of SiC Thin Films on Si–stabilized alpha–SiC (0001) at Low Temperatures by Solid–source Molecular Beam Epitaxy", *Journal of Crystal Growth, 154*, 72–80, (1995).

Friedrichs, P., et al., "Interface Properties of Metal–Oxide–Semiconductor Structures on N–Type 6H and 4H–SiC", *J. Applied Physics, 79*, 7814–7819, (May 15, 1996).

Fujii, T., et al., "Bonding Structures in Highly Photoconductive a–SiC:H Films Deposited by Hybrid–Plasma Chemical Vapor Deposition", *Journal of Non–Crystalline Solids, 198–200*, 577–581, (1996).

Goetzberger, A., et al., *Applied Solid State Science: Advances in Materials and Device Research*, R. Wolfe, ed., Academic Press, New York, Including p. 233, (1969).

Graul, J., et al., "Growth Mechanism of Polycrystalline beta–SiC Layers on Silicon Substrate", *Applied Phys. Lett., 21*, 67–69, (Jul. 1972).

Hamakawa, Y., et al., "Optoelectronics and Photovoltaic Applications of Microcrystalline SiC", *Materials Research Society Symposium Proceedings, 164*, Boston, MA, 291–301, (Nov. 29–Dec. 1, 1989).

He, Z., et al., "Ion–beam–assisted Deposition of Si–carbide Films", *Thin Solid Films, 260*, 32–37, (1995).

Hu, G., "Will Flash Memory Replace Hard Disk Drive?", *IEEE Electron Devices Meeting, Session 24*, (Dec. 13, 1994).

Hwang, J., et al., "High Mobility beta–SiC Epilayer Prepared by Low–pressure Rapid Thermal Chemical Vapor Deposition on a (100) Silicon Substrate", *Thin Solid Films, 272*, 4–6, (1996).

Jou, s., et al., "Electron Emission Characterization of Diamond Thin Films Grown from a Solid Carbon Source", *Thin Solid Films, 280*, 256–261, (1996).

Kothandaraman, M., et al., "Reactive Ion Etching of Trenches in 6H–SiC", *J. Electronic Materials, 25*, 875–878, (1996).

Kumbhar, A., et al., "Growth of Clean Amorphous Silicon––Carbon Alloy Films by Hot–Filament Assisted Chemical Vapor Deposition Technique", *Applied Phys. Lett, 66*, 1741–1743, (Apr. 1995).

Lakshmi, E., et al., "Interface–State Characteristics of GaN/GaAs MIS Capacitors", *Solid–State Electronics, 25*, 811–815, (1982).

Lanois, F., et al., "Angle Etch Control for Silicon Carbide Power Devices", *Applied Phys. Lett., 69*, 236–238, (Jul. 1996).

Lau, S., et al., "Optoelectronic Properties of Highly Conductive Microcrystalline SiC Produced by Laser Crystallization of Amorphous SiC", *J. of Non–Crystalline Solids, 198–200*, 907–910, (1996).

Leggieri, G., et al., "Laser Ablation Deposition of Silicon Carbide Films", *Applied Surface Science, 96–98*, 866–869, (1996).

Lei, T., et al., "Epitaxial Growth and Characterization of Zinc–Blende Gallium Nitride on (001) Silicon", *J. Appl. Phys., 71*, 4933–4943, (May 1992).

Liu, J., et al., "Formation of SiC Films on Silicon Field Emitters", *Materials Res. Soc. Symp. Proc., 311*, San Francisco, CA, (Apr. 13–15, 1993).

Liu, J., et al., "Modification of Si Field Emitter Surfaces by Chemical Conversion to SiC", *J. Vac. Sci. Technology, B 12*, 717–721, (1994).

Luo, J., et al., "Localized Epitaxial Growth of Hexagonal and Cubic SiC Films on Si by Vacuum Annealing", *Applied Phys. Lett., 69*, 916–918, (Aug. 1996).

Martins, R., et al., "Transport Properties of Doped Silicon Oxycarbide Microcrystalline Films Produced by Spatial Separation Techniques", *Solar Energy Materials and Solar Cells, 41–42*, 493–517 (1996).

Martins, R., et al., "Wide Band Gap Microcrystalline Silicon Thin Films", *Diffusion and Defect Data : Solid State Phenomena, 44–46, Part 1*, Scitec Publications, 299–346, (1995).

Maury, F., et al., "Chemical Vapor Co–Deposition of C and SiC at Moderate Temperature for the Synthesis of Compositionally Modulated Si (x ) C (1–x) Ceramic Layers", *Surface and Coatings Technology, 76–77*, 119–125, (1995).

McLane, G., et al., "High Etch Rates of SiC in Magnetron Enhanced SF (6) Plasmas", *Applied Phys. Lett., 68*, 3755–3757, (Jun. 1996).

Mogab, C., et al., "Conversion of Si to Epitaxial SiC by Reaction with C (2) H (2)", *J. Applied Physics, 45*, 1075–1084, (Mar. 1974).

Molnar, R., et al., "Growth of Gallium Nitride by Electron–Cyclotron Resonance Plasma–Assisted Molecular–Beam Epitaxy: The Role of Charged Species", *J. Appl. Phys., 76*, 4587–4595, (1994).

Muller, K., et al., "Trench Storage Node Technology for Gigabit DRAM Generations", *Digest IEEE Int. Electron Devices Meeting*, San Francisco, CA, 594–597, (Dec. 1996).

Nemanich, P., et al., "Diamond Negative Electron Affinity Surfaces, Structures and Devices", *Proc. : Third International Conference on Applications of Diamond Films and Related Materials, 1*, Gaithersburg, MD, 17–24, (1995).

Nemanich, R., et al., "Negative Electron Affinity Surfaces of Aluminu Nitride and Diamond", *Diamond and Related Materials, 5*, 790–796, (1996).

Ouyang, M., et al., "Deposition of Diamond–Like Carbon Films via Excimer Laser Ablation of Polybutadiene", *Materials Science and Engineering, B39*, 228–231, (1996).

Pankove, J., "Photoelectric Emission", *In: Optical Processes in Semiconductors*, Dover Publications Inc., New York, 287–301, (1971).

Pankove, J., et al., "Photoemission from GaN", *Applied Phys. Lett., 25*, 53–55, (1974).

Papadas, C., et al., "Modeling of the Intrinsic Retention Characteristics of FLOTOX EEPROM Cells Under Elevated Temperature Conditions", *IEEE Transaction on Electron Devices, 42*, 678–682, (Apr. 1995).

Patuwathavithane, C., et al., "Oxidation Studies for 6H–SiC", *Proc: 4th Int. Conf. on Amorphous and Crystalline Silicon Carbide IV*, Santa Clara, CA, 163–169, (Oct. 9–11, 1991).

Pereyra, I., et al., "Wide Gap a–Si (1–x) C (x) : H Thin Films Obtained Under Starving Plasma Deposition Conditions", *J. Non–Crystalline Solids, 201*, 100–118, (1996).

Pollack, S., "Electron Transport Through Insulating Thin Films", *Appl. Solid–State Science, 1*, 345–355, (1969).

Prendergast, J., "FLASH of DRAM: Memory Choice for the Future", *IEEE Electron Device Meeting, Session 25*, Phoenix, AZ, (1995).

Rahman, M., et al., "Preparation and Electrical Properties of An Amorphous SiC/ Crystalline Si p (+) n Heterostructure", *Japanese J. Applied Physics, 23*, 515–524, (May 1984).

Renlund, G., et al., "Silicon Oxycarbide Glasses: Part I. Preparation and Chemistry", *Journal of Materials Research, 6*, 2716–2722, (Dec. 1991).

Renlund, G., et al., "Silicon Oxycarbide Glasses: Part II. Structure and Properties", *Journal of Materials Research, 6*, 2723–2734, (Dec. 1991).

Schmidt, I., et al., "Low Temperature Diamond Growth Using Fluorinated Hydrocarbons", *Diamond and Related Materials, 5*, 1318–1322, (1996).

Serre, C., et al., "Ion–Beam Synthesis of Amorphous SiC Films: Structural Analysis and Recrystallization", *J. Appl. Phys., 79*, 6907–6913, (May 1996).

Sim, S., et al., "A New Planar Stacked Technology (PST) for Scaled and Embedded DRAMs", *Digest IEEE Int. Electron Devices Meeting*, San Francisco, CA, 504–507, (Dec. 1996).

Suzaki, Y., et al., "Quantum Size Effects of a Si ( :H) /a–SiC ( :H) Multilayer Films Prepared by rf Sputtering", *Abstracts of Papers Published in the Int. J. Japenese Soc. for Precision Engineering, 28*, Abstract of Paper in vol. 60, 182, (Jun. 1994).

Svirkova, N., et al., "Deposition Conditions and Density–of–States Spectrum of a–Si (1–x) C (x) :H Films Obtained by Sputtering", *Semiconductors, 28*, 1164–1169, (Dec. 1994).

Sze, S., *Physics of Semiconductors*, 2nd Edition., John Wiley & Sons, Pub., New York, ISBN 0471056618, (1981).

Tarui, Y., "Flash Memory Features Simple Structure, Superior Integration", *Jee, 30*, 84–87, (Sep. 1993).

Tenhover, M. et al., "DC–Magnetron Sputtered Silicon Carbide", *Materials Res. Soc. Symp. Proc., 356*, Boston, MA, 227–232, (Nov. 28–Dec. 2, 1994).

Thomas, J., et al., "Plasma Etching and Surface Analysis of a–SiC :H Films Deposited by Low Temperature Plasma Enhanced Chemical Vapor Deposition", *Materials Res. Soc. Symp. Proc., 334*, Boston, MA, 445–450, (Nov. 29–Dec. 2, 1993).

Tiwari, S., et al., "A silicon nanocrystal based memory", *Appl. Physics Lett., 68*, 1377–1379, (1996).

Tiwari, S., et al., "Volatile and Non–Volatile Memories in Silicon with Nano–Crystal Storage", *Abstract of IEEE Int. Electron Devices Meeting*, Washington, DC, 521–524, (Dec. 1995).

Tucker, C., et al., "Ion–beam–assisted Deposition of Non-hydrogenated a–Si:C Films", *Can. J. Physics, 74*, 97–101, (1996).

van der Weide, J., et al., "Negative–electron–affinity Effects on the Diamond (100) Surface", *Physical Review B [Condensed Matter], 50*, 5803–5806, (Aug. 15, 1994).

Vodakov, Y., et al., "Diffusion and Solubility of Impurities in Silicon Carbide", *In: Silicon Carbide*, R.C. Marshall, et al., eds., Univ. of South Carolina Press, 508–519, (1973).

Wahab, Q., et al., "3C–SiC / Si / 3C–SiC Epitaxial Trilayer Films Deposited on Si (111) Substrates by Reactive Magnetron Sputtering", *J. Materials Res., 10*, 1349–1351, (Jun. 1995).

Watanabe, A., et al., "SiC Thin Film Preparation by ArF Excimer Laser Chemical Vapor Deposition. Part 1: Rate of Photolysis of Alkylsilanes by ArF Excimer Laser and their Decomposition Products", *Thin Solid Films, 274*, 70–75, (1996).

Wolter S., et al., "Textured Growth of Diamond on Silicon via in situ Carburization and Bias–Enhanced Nucleation", *Appl. Phys. Lett., 62*, 1215–1217, (Mar. 1993).

Wu, K., et al., "The Growth and Characterization of Silicon/Silicon Carbide Heteroepitaxial Films on Silicon Substrates by Rapid Thermal Chemical Vapor Deposition", *Japanese J. Appl. Phys., 35*, 3636–3840, (1996).

Yamaguchi, Y., et al., "Properties of Heteroepitaxial 3C–SiC Films Growth by LPCVD", *Digest of Tech. Papers: 8th Int. Conf. on Solid–State Sensors and Actuators and Eurosensors IX*, vol. 2, Stockholm, Sweden, 190–193, (Jun. 1995).

Yamanashi, H., et al., "Deposition of Silicon Compound Thin Films in DC Discharge Plasma Using Hydrogen–Hexamethyldisilane Gas Mixture", *Proc.: Int. Symp. on Surfaces and Thin Films of Electronic Materials. Bull. of the Res. Institute of Electronics, Shizuoka University, 30*, 95–98, (1995).

Yee, A., et al., "The Effect of Nitrogen on Pulsed Laser Deposition of Amorphous Silicon Carbide Films: Properties and Structure", *J. Materials Research, 11*, 1979–1986, (1996).

Yoder, M., "Wide Bandgap Semiconductor Materials and Devices", *IEEE Transactions on Electron Devices, 43*, 1633–1636, (Oct. 1996).

* cited by examiner

US 6,936,849 B1

SILICON CARBIDE GATE TRANSISTOR

FIELD OF THE INVENTION

The present invention relates generally to integrated circuits, and particularly to a silicon carbide gate field-effect transistor and complementary metal-oxide-semiconductor (CMOS) compatible method of fabrication.

BACKGROUND OF THE INVENTION

Field-effect transistors (FETs) are typically produced using a standard complementary metal-oxide-semiconductor (CMOS) integrated circuit fabrication process. As is well known in the art, such a process allows a high degree of integration such that a high circuit density can be obtained with relatively few well-established masking and processing steps. A standard CMOS process is typically used to fabricate FETs that each have a gate electrode that is composed of n-type conductively doped polycrystalline silicon (polysilicon) material.

The intrinsic properties of the polysilicon gate material affect operating characteristics of the FET that is fabricated using a standard CMOS process. Silicon (monocrystalline and polycrystalline) has intrinsic properties that include a relatively small energy band gap ($E_g$), e.g. approximately 1.2 Volts, and a corresponding electron affinity ($\chi$) that is relatively large, e.g. $\chi \approx 4.2$ eV. For example, for p-channel FETs fabricated by a typical CMOS process, these and other material properties result in a large turn-on threshold voltage ($V_T$) magnitude. As a result, the $V_T$ magnitude must be downwardly adjusted by doping the channel region that underlies the gate electrode of the FET. Doping to adjust the $V_T$ magnitude typically includes the ion-implantation of acceptor dopants, such as boron, through the polysilicon gate material and an underlying gate insulator into the channel region of the underlying silicon substrate. A typical $V_T$ magnitude of approximately 0.7 Volts results from the ion-implantation adjustment step.

One drawback of polysilicon gate FETs is that the $V_T$ magnitude adjustment by ion-implantation is particularly difficult to carry out in semiconductor-on-insulator (SOI) and other thin film transistor technology. In SOI technology, the FET channel region is formed in a semiconductor layer that is formed upon an insulating region of the substrate. The semiconductor layer may be only 1000 Å thick, making it difficult to obtain a sufficiently sharply defined dopant distribution through ion-implantation.

Another drawback of polysilicon gate FETs is that their intrinsic characteristics are likely to change during subsequent high temperature process steps. For example, the polysilicon gate is typically doped with boron impurities that have a high diffusivity in polysilicon. Because of this high diffusion rate, the boron impurities that are introduced into the polysilicon gate electrode of the FET diffuse through the underlying gate oxide during subsequent high temperature processing steps. As a result, the $V_T$ magnitude the FETs may change during these subsequent high temperature processing steps.

For the reasons stated above, and for other reasons stated below which will become apparent to those skilled in the art upon reading and understanding the present specification, there is a need in the art for a transistor having an even lower $V_T$ magnitude, in order to operate at lower power supply voltages. There is an additional need in the art to obtain such lower $V_T$ magnitudes without using ion-implantation, particularly for thin film transistor devices in a SOI process. There is a further need in the art to obtain $V_T$ magnitudes that remain stable in spite of subsequent thermal processing steps.

Halvis et al. (U.S. Pat. No. 5,369,040) discloses a charge-coupled device (CCD) photodetector which has transparent gate MOS imaging transistors fabricated from polysilicon with the addition of up to 50% carbon, and preferably about 10% carbon, which makes the gate material more transparent to the visible portion of the energy spectrum. However, the Halvis et al. patent is directed to improving gate transmissivity to allow a greater portion of incident light in the visible spectrum to penetrate the gate. Halvis et al. did not recognize the need to improve the gate characteristics of FETs by lowering $V_T$ magnitudes or stabilizing $V_T$ magnitudes over subsequent thermal processing steps. Halvis et al. does not disclose or suggest the use of carbon in a field-effect transistor gate in the absence of incident light. Thus, the above described needs are unresolved in the art of fabrication of FETs using CMOS processes.

SUMMARY OF THE INVENTION

One aspect of the present invention provides a field-effect transistor (FET) having an electrically interconnected gate formed of polycrystalline or microcrystalline silicon carbide (SiC) material. The SiC gate material has a lower electron affinity and a higher work function than a polysilicon gate material. The characteristics of the SiC gate FET include a lower threshold voltage ($V_T$) magnitude and a lower tunneling barrier voltage as compared to polysilicon gate FETs.

Another aspect of the invention provides a method for fabricating a transistor including an electrically interconnected SiC gate. Source and drain regions are fabricated in a silicon substrate, separated from each other and defining a channel region therebetween. An insulating region is fabricated over the channel region. A SiC gate is fabricated over the insulating region. In one embodiment, SiC gate fabrication includes depositing an SiC layer on the insulating region using low pressure chemical vapor deposition (LPCVD) and etching the SiC material to a desired pattern using a reactive ion etch (RIE) process.

The invention provides numerous advantages. For example, the SiC gate FET provides lower $V_T$ magnitudes, allowing integrated circuit operation at lower power supply voltages. The lower power supply voltage, in turn, provides advantages including lower power consumption and ease in downward scaling of transistor dimensions without unacceptably increasing electric fields. The lower $V_T$ magnitudes also enable higher switching speeds and improved performance. The SiC gate FET also provides lower $V_T$ magnitudes without adjustment by ion-implantation. This is particularly useful for semiconductor-on-insulator (SOI) and other thin film transistor devices in which an adequately sharply defined dopant distribution is difficult to obtain by ion-implantation $V_T$ adjustment. The SiC gate FET also provides $V_T$ magnitudes that are stable in spite of subsequent thermal processing steps. The SiC gate FET further provides more optimal $V_T$ magnitudes for n-channel FETs (e.g., enhancement rather than depletion mode).

BRIEF DESCRIPTION OF THE DRAWINGS

In the drawings, like numerals describe substantially similar components throughout the several views.

DETAILED DESCRIPTION OF THE INVENTION

Figure 1:
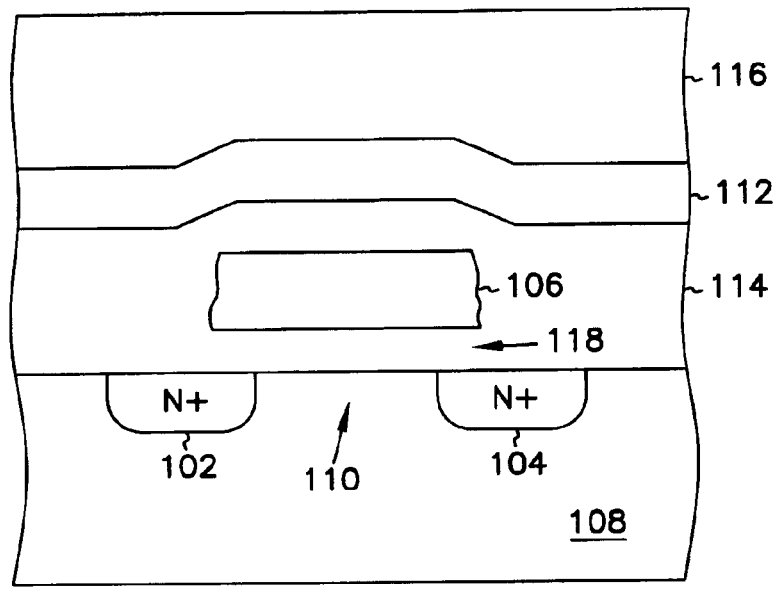
FIG. 1 is a cross-sectional view, illustrating generally one embodiment of a transistor according to one aspect of the invention, including a silicon carbide (SiC) gate.

In the following detailed description of the preferred embodiment, reference is made to the accompanying drawings which form a part hereof, and in which is shown, by way of illustration, a specific embodiment in which the invention may be practiced. In the drawings, like numerals describe substantially similar components throughout the several views. This embodiment is described in sufficient detail to enable those skilled in the art to practice the invention. Other embodiments may be utilized and structural and electrical changes may be made without departing from the scope of the present invention. The terms wafer and substrate used in the following description include any semiconductor-based structure having an exposed surface with which to form the integrated circuit structure of the invention. Wafer and substrate are used interchangeably to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The following detailed description is, therefore, not to be taken in a limiting sense, and the scope of the present invention is defined only by the appended claims.

The present invention discloses a field-effect transistor (FET) having a gate that is formed of a polycrystalline or microcrystalline silicon carbide (SiC) material, which includes any material that incorporates both silicon and carbon into the gate region of a FET. The SiC gate FET includes characteristics such as, for example, a lower electron affinity and a higher work function than a conventional polycrystalline silicon (polysilicon) gate FET. In one embodiment, the FET gate is electrically interconnected or otherwise driven by an input signal. The SiC gate FET provides lower threshold voltage ($V_T$) magnitudes, allowing operation at lower power supply voltages. This, in turn, allows lower power consumption, and facilitates the downward scaling of transistor dimensions without increasing electric fields unacceptably. The lower $V_T$ magnitudes also enable higher switching speeds and improved performance. The SiC gate FET also provides lower $V_T$ magnitudes without adjustment by ion-implantation. This is particularly useful for semiconductor-on-insulator (SOI) and other thin film transistor devices in which a sufficiently sharp doping profile is difficult to obtain by ion-implantation. The SiC gate FET also includes $V_T$ magnitudes that are stable in spite of subsequent thermal processing steps. The SiC gate FET further provides more optimal threshold voltage magnitudes for n-channel FETs (e.g., enhancement rather than depletion mode). In another embodiment, the SiC gate FET further provides floating gate transistors having lower tunneling barriers, such as described in Forbes U.S. Pat. No. 5,801,401 issued Sep. 1, 1998, and entitled "Flash Memory with Microcrystalline Silicon Carbide Film Floating Gate," which is assigned to the assignee of the present application and which is herein incorporated by reference. This allows faster storage and removal of charge from the floating gates, and is particularly useful for speeding erasing and writing operations in flash electrically erasable and programmable read-only memories (EEPROMs) and other applications.

FIG. 1 is a cross-sectional view illustrating generally, by way of example, one embodiment of a n-channel FET provided by the invention. The FET includes a source region 102, a drain region 104 and a gate region 106. In one embodiment, source 102 and drain 104 are fabricated by forming highly doped (n+) regions in a lightly doped (p−) silicon semiconductor substrate 108. In another embodiment, substrate 108 includes a thin semiconductor surface layer formed on an underlying insulating portion, such as in a SOI or other thin film transistor process technology. Source 102 and drain 104 are separated by a predetermined length in which a channel region 110 is formed.

According to one aspect of the invention, gate 106 is formed of SiC material. The silicon carbide material forming gate 106 is described more generally as $Si_{1-x}C_x$. In one embodiment, the SiC gate material is approximately stoichiometric, i.e., $x \approx 0.5$. However, other embodiments of the invention could include less carbon, i.e., $x<0.5$, or more carbon, i.e., $x>0.5$. For example, but not by way of limitation, one embodiment of the SiC gate material is illustrated by $0.1<x<0.5$. Another example embodiment is illustrated by way of example, but not by way of limitation, by $0.4<x<0.6$. According to one aspect of the invention, the SiC gate material can include either or both polycrystalline or microcrystalline embodiments of the SiC gate material.

In one embodiment, an insulating layer, such as silicon dioxide (oxide) 114 or other insulating layer, is formed by chemical vapor deposition (CVD). Oxide 114 isolates gate 106 from other layers, such as layer 112. In another embodiment, gate 106 is oxidized to form at least a portion of oxide 114 to isolate gate 106 from other layers such as layer 112. In one embodiment, for example, layer 112 is a polysilicon control gate in a floating gate transistor in an electrically erasable and programmable read-only memory (EEPROM) memory cell. In this embodiment, gate 106 is floating (electrically isolated) for charge storage thereupon, such as by known EEPROM techniques. In another embodiment such as, for example, a driven gate embodiment in which gate 106 is electrically interconnected, layer 112 is a metal or other conductive interconnection line that is located above gate 106.

The upper layers, such as layer 112, can be covered with a layer 116 of a suitable insulating material in the conventional manner, such as for isolating and protecting the physical integrity of the underlying features. Gate 106 is isolated from channel 110 by an insulating layer such as thin oxide layer 118, or any other suitable dielectric material. In one embodiment, thin oxide layer 118 is a gate oxide layer that can be approximately 100 angstroms (Å) thick, such as for conventional FET operation. In another embodiment, such as in a floating gate transistor, thin oxide layer 118 is a tunnel oxide material that can be approximately 50–100 Å thick.

The SiC gate 106 has particular advantages over polysilicon gates used in FETs fabricated using a conventional complementary metal-oxide-semiconductor (CMOS) process due to different characteristics of the SiC material. For example, SiC is a wide bandgap semiconductor material with a bandgap energy of about 2.1 eV, in contrast to silicon (monocrystalline or polycrystalline), which has a bandgap energy of about 1.2 eV. Moreover, SiC has an electron affinity of about 3.7 to 3.8 eV, in contrast to silicon, which has an electron affinity of about 4.2 eV. The smaller electron affinity of the SiC gate 106 material reduces the barrier potential at the interface between gate 106 and thin oxide layer 118. In an embodiment in which thin oxide layer 118 is a tunnel oxide in a floating gate transistor EEPROM memory cell, the lower electron affinity of SiC reduces the tunneling distance and increases the tunneling probability. This speeds the write and erase operations of storing and removing charge by Fowler-Nordheim tunneling to and from the gate 106, which is a floating gate. This is particularly advantageous for "flash" EEPROMs in which many floating gate transistor memory cells must be erased simultaneously. The large charge that must be transported by Fowler-Nordheim tunneling during the erasure of a flash EEPROM typically results in relatively long erasure times. By reducing the tunneling distance and increasing the tunneling probability, the SiC gate 106 reduces erasure times in flash EEPROMs.

P-type SiC also has a larger work function than polysilicon, providing other advantages for a FET having a SiC gate 106, particularly in an electrically interconnected or driven gate embodiment of the present invention. For example, large work function gates provide advantages for FETs fabricated using SOI starting material and process technology. In an SOI process, p-channel polysilicon gate FETs typically operate as fully depleted thin film transistor devices and require $V_T$ magnitude adjustment by ion-implantation. However, such ion-implantation adjustment is difficult because the semiconductor layer may be only 1000 Å thick, making it difficult to obtain a sufficiently sharply defined dopant distribution through ion-implantation. The p-type SiC gate, however, has a larger work function than polysilicon, thereby providing reduced $V_T$ magnitudes for p-channel FETs without adjustment by ion-implantation. The reduced $V_T$ magnitudes of the p-channel FETs advantageously allows operation at lower power supply voltages. This, in turn, lowers power consumption and facilitates the downward scaling of FET dimensions without increasing electric fields unacceptably. The reduced $V_T$ magnitudes also enable higher switching speeds and improved integrated circuit performance. Furthermore, the $V_T$ magnitudes obtained according to the present invention are stable in spite of subsequent thermal processing steps, since no migratory dopants are ion-implanted to adjust the p-channel $V_T$ magnitude. Such lower $V_T$ magnitudes and accompanying advantages are difficult to achieve by other integrated circuit manufacturing techniques.

Large work function p-type SiC gates also provide advantages for n-channel FETs. For example, while polysilicon gate FETs tend to result in depletion mode n-channel $V_T$ magnitudes, ptype SiC gates more easily provide enhancement mode operation, which is often a more desirable device characteristic for designing integrated circuits.

Figure 1A:
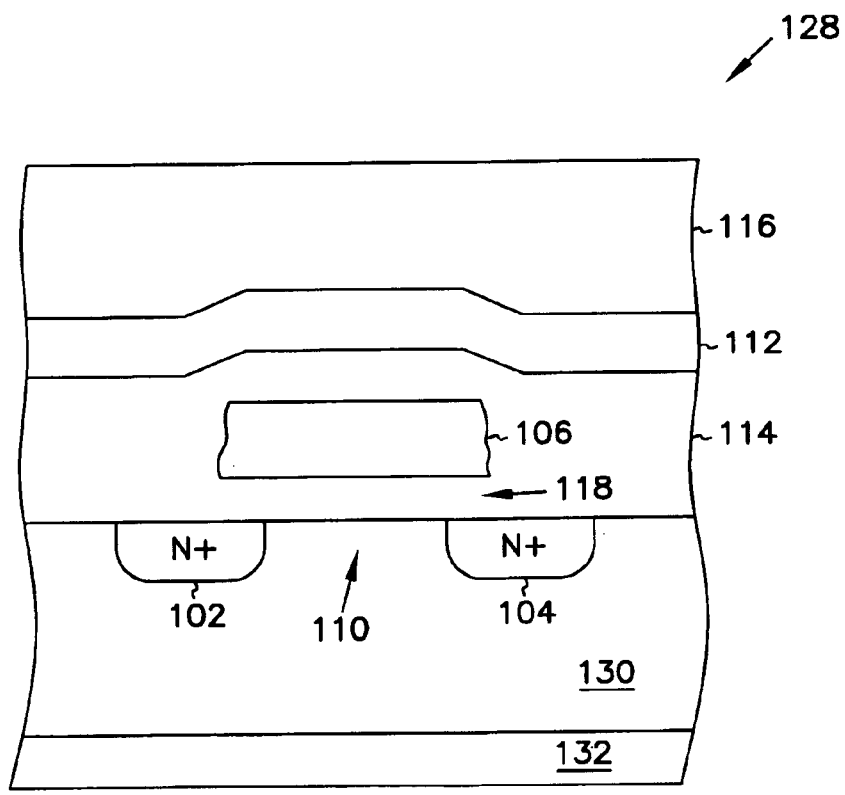
FIG. 1A is a cross-sectional view, illustrating generally one embodiment of a transistor according to one aspect of the invention, including a silicon carbide (SiC) gate and a semiconductor surface layer formed on an underlying insulating portion.

FIG. 1A is a cross-sectional view illustrating generally, by way of example, another embodiment of an n-channel FET 128 provided by the invention. A source region 102 and a drain region 104 are formed in a thin semiconductor surface layer 130 that is formed on an underlying insulating portion 132. The other elements of the FET 128 are similar to the corresponding elements in the n-channel FET shown in FIG. 1, and have retained the same reference numerals for purposes of brevity.

Figure 2:
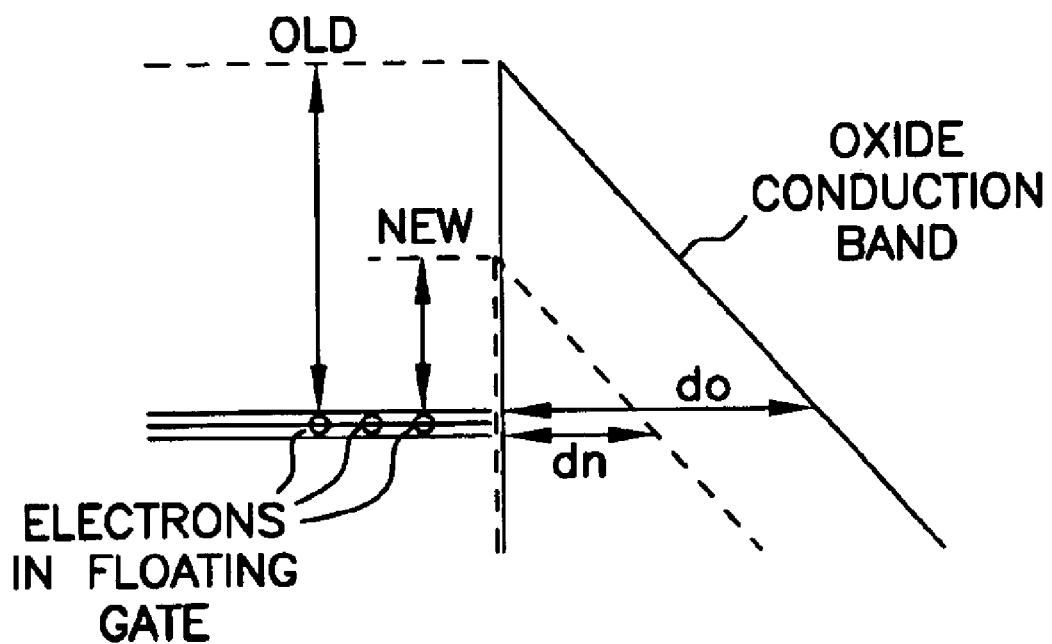
FIG. 2 is a graph, illustrating generally barrier height versus tunneling distance for a SiC gate transistor.

FIG. 2 illustrates generally how the smaller electron affinity provides a smaller barrier potential. The smaller barrier potential reduces the distance that electrons stored on the gate have to traverse by Fowler-Nordheim tunneling to be stored upon or removed from the polycrystalline or microcrystalline SiC gate 106. The reduced tunneling distance allows easier charge transfer, such as during writing or erasing data in a floating gate transistor in a flash EEPROM memory cell. In FIG. 2, "do" represents the tunneling distance of a typical polysilicon floating gate transistor due to the barrier height represented by the dashed line "OLD". The tunneling distance "dn" corresponds to a SiC gate and its smaller barrier height represented by the dashed line "SNEW". Even a small reduction in the tunneling distance results in a large increase in the tunneling probability, because the tunneling probability is an exponential function of the reciprocal of the tunneling distance. The increased tunneling probability of the SiC gate 106 advantageously provides faster programming and erasure times for SiC gate floating gate transistors in flash EEPROM memories. Flash EEPROM memories using lower $V_T$ magnitude SiC gate floating gate transistors also operate at lower power supply voltages, as described above.

The transistor of FIG. 1 illustrates generally, by way of example, an n-channel FET that includes an SiC gate. In one embodiment, for example, the transistor can be formed on substrate 108 using an n-well CMOS process, enabling monolithic CMOS fabrication of n-channel and p-channel FETs on a common substrate. In one embodiment, both the n-channel and the p-channel FETs include a polycrystalline or microcrystalline SiC gate. Thus, with appropriate doping, the FET illustrated in FIG. 1 could also represent a p-channel FET. Applications of the p-channel and n-channel SiC gate FETs include any application in which conventionally formed polysilicon gate FETs are used.

FIGS. 3A–3H illustrate generally examples of process steps for fabricating n-channel and p-channel SiC gate transistors according to the present invention. The n-channel and p-channel FETs can be produced on a silicon or other semiconductor substrate, an SOI substrate, or any other suitable substrate 108. Only the process steps that differ from conventional CMOS process technology are described in detail.

Figure 3A:
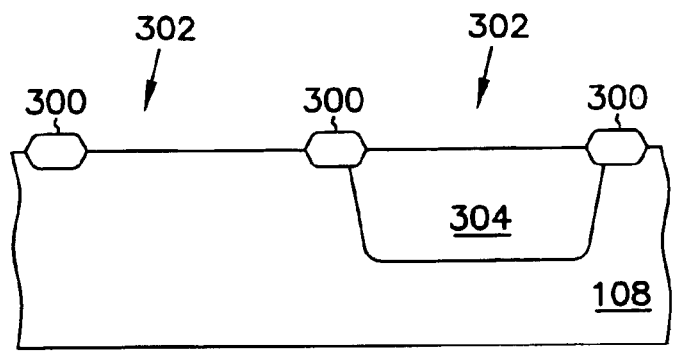
FIGS. 3A–3H illustrate generally examples of process steps for fabricating n-channel and p-channel SiC gate transistors.

In FIG. 3A, substrate 108 undergoes conventional CMOS processing up to the formation of the gate structure, including formation of field oxide 300 for defining active regions 302, and the formation of well regions, such as n-well 304 in which p-channel transistors will be fabricated.

Figure 3B:
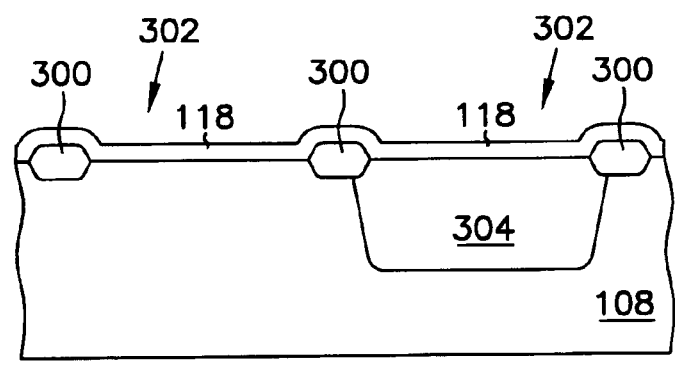

In FIG. 3B, an insulating layer, such as thin oxide layer 118, is formed on substrate 108, such as by dry thermal oxidation, including over the portions of the active area regions 302 in which n-channel and p-channel FETs are formed. In one embodiment, thin oxide layer 118 is a gate oxide layer that can be approximately 100 angstroms (Å) thick. In another embodiment, such as in a floating gate transistor, thin oxide layer 118 is a tunnel oxide material that can be approximately 50–100 Å thick.

Figure 3C:
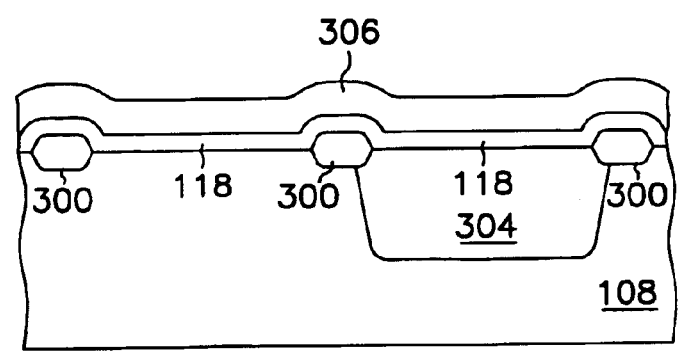

In FIG. 3C, a thin film 306 of conductively doped polycrystalline or microcrystalline SiC is then deposited, such as by chemical vapor deposition (CVD) over the entire wafer, including over thin oxide layer 118. The chemical composition of thin film 306 may be different for the particular deposition conditions of the polycrystalline and microcrystalline SiC, as illustrated by way of the particular examples described above.

Conventional FETs usually use n+ doped (e.g., phosphorus as dopant) gate regions for both p-channel and n-channel FETs, even thought p+ doped (e.g., boron as dopant) gate regions would provide more desirable operating characteristics. This is because boron easily diffuses out of the polysilicon gate regions during subsequent high temperature processing steps. By contrast, one aspect of the present invention is that it allows formation of n+ doped or p+ doped SiC gate regions. Since the diffusion rate of the boron dopant is lower in SiC than in polysilicon, boron can be used as a dopant in the SiC gate material. Thus, one advantage of the present invention is that the $V_T$ magnitudes in the SiC gate FETs are less affected by subsequent high temperature process steps than those of conventional polysilicon gate FETs. This allows greater control of the $V_T$ magnitudes in the SiC gate FETs of the present invention.

In one embodiment, for example, SiC film 306 is deposited using low-pressure chemical vapor deposition (LPCVD), providing the structure illustrated in FIG. 3C. The LPCVD process uses either a hot-wall reactor or a cold-wall reactor with a reactive gas, such as a mixture of $Si(CH_3)_4$ and Ar. Examples of such processes are disclosed in an article by Y. Yamaguchi et al., entitled "Properties of Heteroepitaxial 3C-SiC Films Grown by LPCVD", in the *8th-International Conference on Solid-State Sensors and Actuators and Eurosensors IX. Digest of Technical Papers,* page 3. vol. (934+1030+85), pages 190–3, Vol. 2, 1995, and in an article by M. Andrieux, et al., entitled "Interface and Adhesion of PECVD SiC Based Films on Metals", in supplement *Le Vide Science.Technigue et Applications. (France).* No. 279, pages 212–214, 1996. However, SiC film 306 can be deposited using other techniques such as, for example, enhanced CVD techniques known to those skilled in the art including low pressure rapid thermal chemical vapor deposition (LP-RTCVD), or by decomposition of hexamethyl disalene using ArF excimer laser irradiation, or by low temperature molecular beam epitaxy (MBE). Other examples of forming SiC film 306 include reactive magnetron sputtering, DC plasma discharge, ion-beam assisted deposition, ion-beam synthesis of amorphous SiC films, laser crystallization of amorphous SiC, laser reactive ablation deposition, and epitaxial growth by vacuum anneal. The conductivity of the SiC film 306 can be changed by ion implantation during subsequent process steps, such as during the self-aligned formation of source/drain regions for the n-channel and p-channel FETs.

Figure 3D:
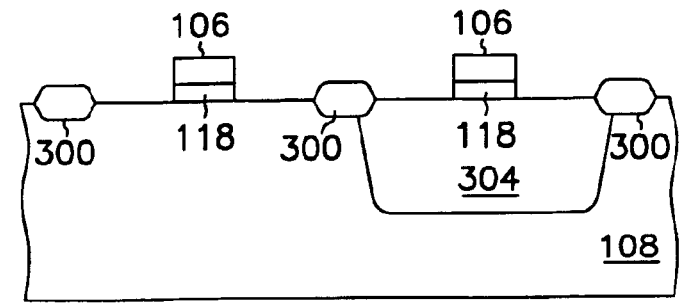

In FIG. 3D, SiC film 306 is patterned and etched, together with the underlying thin oxide layer 118, to form SiC gate 106. SiC film 306 is patterned using standard techniques and is etched using plasma etching, reactive ion etching (RIE) or a combination of these or other suitable methods. For example, SiC film 306 can be etched by RIE in a distributed cyclotron resonance reactor using a $SF_6/O2$ gas mixture using $SiO_2$ as a mask with a selectivity of 6.5. Such process is known in the art and is disclosed, for example, in an article by F. Lanois, entitled "Angle Etch Control for Silicon Power Devices", which appeared in *Applied Physics Letters;* Vol 69, No. 2, pages 236–238, Jul. 1996. Alternatively, SiC film 306 can be etched by RIE using the mixture $SF_6$ and O2 and $F_2/Ar/O_2$. An example of such a process is disclosed in an article by N. J. Dartnell, et al., entitled "Reactive Ion Etching of Silicon Carbide" in *Vacuum,* Vol. 46, No. 4, pages 349–355, 1955. The etch rate of SiC film 306 can be significantly increased by using magnetron enhanced RIE.

Figure 3E:
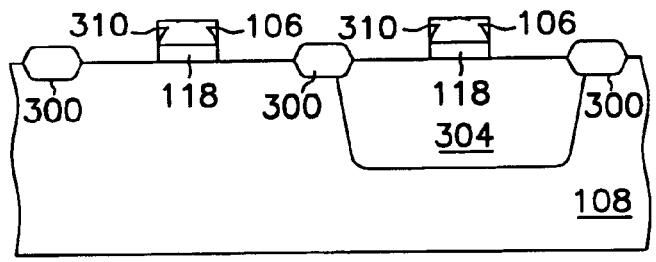

FIG. 3E illustrates one embodiment in which SiC gate 106 is oxidized after formation, providing a thin layer 310 represented by the dashed line in FIG. 3E. SiC gate 106 can be oxidized, for example, by plasma oxidation similar to reoxidation of polycrystalline silicon. During the oxidation process, the carbon is oxidized as carbon monoxide or carbon dioxide and vaporizes, leaving the thin layer 310 of silicon oxide over SiC gate 106. In one embodiment, thin layer 310 is used as, or as a portion of, an intergate dielectric between floating and control gates in a floating gate transistor embodiment of the present invention.

Figure 3F:
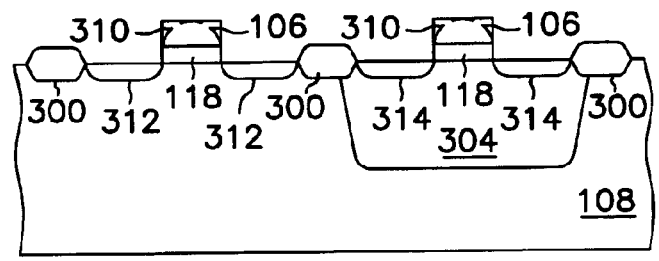

FIG. 3F illustrates generally a self-aligned embodiment of the formation of n-channel FET source/drain regions 312 and p-channel FET source/drain regions 314 for the p-channel FET. The doping of SiC gate 106 can be changed by ion implantation, such as during the formation of n-channel FET source/drain regions 312 or p-channel FET source/drain regions 314 for the p-channel FET. For example, a p-type SiC film 306 can be deposited, and its doping then changed to n+ by leaving SiC gate 106 unmasked during the formation of the n+ source/drain regions 312 for the n-channel FET.

Figure 3G:
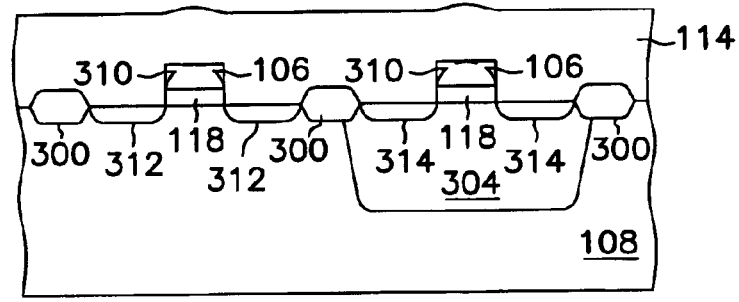
Figure 3H:
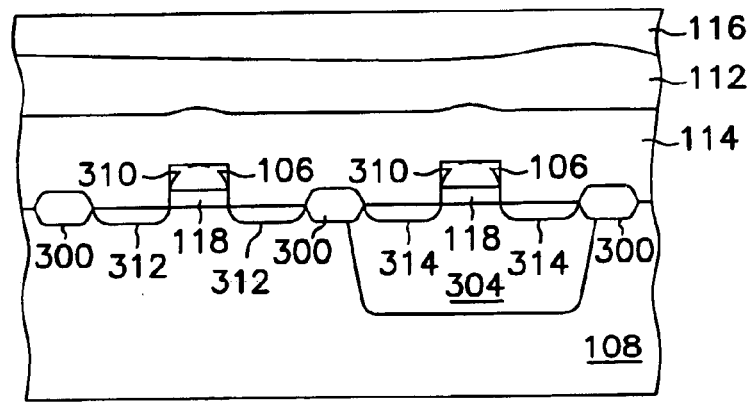

FIG. 3G illustrates generally the formation of an insulating layer, such as oxide 114 or other suitable insulator, after formation of n-channel FET source/drain regions 312 and p-channel FET source/drain regions 314 for the p-channel FET. In one embodiment, oxide 114 is deposited over the upper surface of the integrated circuit structure using a standard CVD process. Oxide 114 isolates SiC gate 106 from other gates such as, for example, an overlying control gate layer 112 where SiC gate 106 is a floating gate in a floating gate transistor EEPROM memory cell. Oxide 114 also isolates SiC gate 106 from any other conductive layer 112, such as polysilicon layers, gates, metal lines, etc., that are fabricated above and over SiC gate 106 during subsequent process steps. Insulating layer 116 is produced on the structure in a conventional manner.

Figure 4:
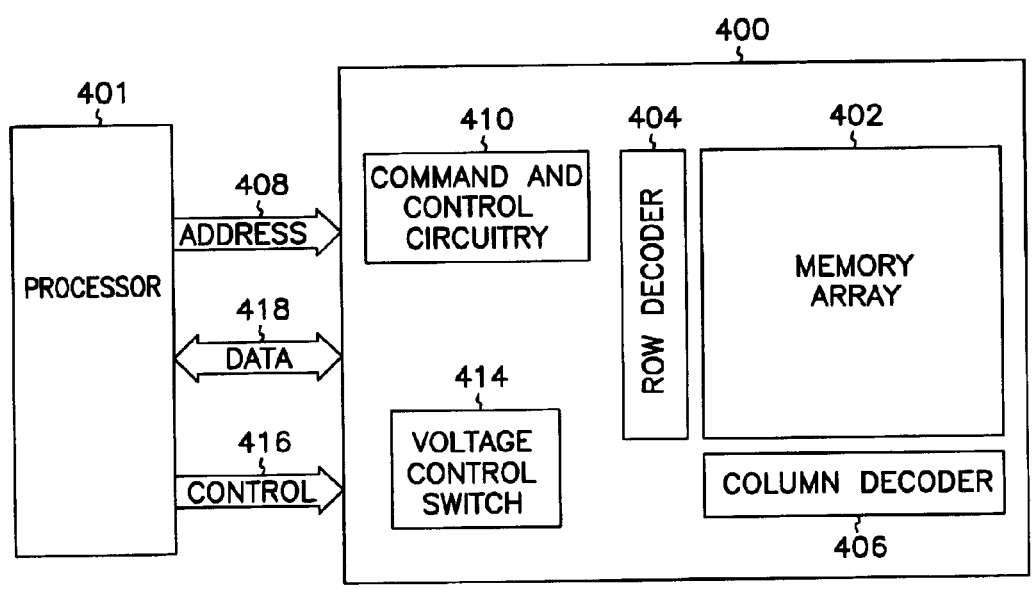
FIG. 4 is a simplified block diagram, illustrating generally one embodiment of a semiconductor memory device incorporating SiC gate transistors.

FIG. 4 is a simplified block diagram illustrating generally one embodiment of a memory 400 system incorporating SiC gate FETs according to one aspect of the present invention. The SiC gate FETs are used in various applications within memory 400 including, for example, in logic and output driver circuits. The SiC gate FETs can also function as memory cell access FETs, such as in a dynamic random access memory (DRAM) embodiment of memory 400, or as other memory elements therein. In one embodiment, memory 400 is a flash EEPROM, and the SiC gate FETs are floating gate transistors that are used for nonvolatile storage of data as charge on the SiC floating gates. However, the SiC gate FETs can also be used in other types of memory systems, including SDRAM, SLDRAM and RDRAM devices, or in programmable logic arrays (PLAs), or in any other application in which transistors are used.

FIG. 4 illustrates, by way of example but not by way of limitation, a flash EEPROM memory 400 comprising a memory array 402 of multiple memory cells. Row decoder 404 and column decoder 406 decode addresses provided on address lines 408 to access addressed SiC gate floating gate transistors in the memory cells in memory array 402. Command and control circuitry 410 controls the operation of memory 400 in response to control signals received on control lines 416 from a processor 401 or other memory controller during read, write, and erase operations.

As described above, the floating SiC gates of the floating gate transistors in memory array 402 advantageously reduce the tunneling distance and increase the tunneling probabilities, thereby speeding write and erase operations of memory 400. This is particularly advantageous for "flash" EEPROMs in which many floating gate transistor memory cells must be erased simultaneously, which normally results in relatively long erasure times. By reducing the tunneling distance and increasing the tunneling probability, charge is more easily transferred to and from the SiC floating gates, thereby reducing erasure times in flash EEPROMs.

Conclusion

Thus, the present invention provides a FET having a polycrystalline or microcrystalline SiC gate. The SiC gate FET characteristics include a lower electron affinity and higher work function than a conventional polysilicon gate FET. The SiC gate FET provides lower $V_T$ magnitudes, allowing operation at lower power supply voltages. This, in turn, lowers power consumption and facilitates downward scaling of transistor dimensions without increasing electric fields unacceptably. The lower $V_T$ magnitudes also enable higher switching speeds and improved performance. The SiC gate FET also provides lower $V_T$ magnitudes without adjustment by ion-implantation. This aspect of the invention is particularly useful for SOI, thin film transistors, and any other devices in which ion-implantation may not yield a sufficiently sharp dopant distribution. The SiC gate FET provides $V_T$ magnitudes that are stable in spite of subsequent thermal processing steps. The SiC gate FET also provides more optimal threshold voltage magnitudes for n-channel FETs (e.g., enhancement rather than depletion mode). In one embodiment, the SiC gate FET has an electrically interconnected or driven gate. In another embodiment, the SiC gate FET further provides floating gate transistors that allow faster storage and erasure such as, for example, used in flash EEPROMs.

Although specific embodiments have been illustrated and described herein, those of ordinary skill in the art will appreciate that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A system comprising:
    a processor; and
    a memory device coupled to the processor, the memory device comprising:
        an array of memory cells comprising a plurality of transistors, at least one of the transistors comprising a source region, a drain region, and a channel region between the source and drain regions in a semiconductor surface layer formed on an underlying insulating portion, and an electrically interconnected gate formed of a silicon carbide compound $Si_{1-x}C_x$, wherein x is less than 0.5, the gate being connected to receive an input signal;
        addressing circuitry to address memory cells in the array; and
        control circuitry to control read, write, and erase operations of the memory device.

2. The system of claim 1 wherein the silicon carbide compound $Si_{1-x}C_x$ comprises polycrystalline silicon carbide or microcrystalline silicon carbide, or both polycrystalline and microcrystalline silicon carbide.

3. The system of claim 1 wherein:
    the semiconductor surface layer comprises p-type silicon;
    the gate is separated from the channel region by gate oxide or tunnel oxide;
    the source region comprises n-type silicon; and
    the drain region comprises n-type silicon.

4. The system of claim 1 wherein:
    the semiconductor surface layer comprises n-type silicon;
    the gate is separated from the channel region by gate oxide or tunnel oxide;
    the source region comprises p-type silicon; and
    the drain region comprises p-type silicon.

5. The system of claim 1 wherein the silicon carbide compound $Si_{1-x}C_x$ is p+ doped with boron or n+ doped with phosphorus.

6. The system of claim 1 wherein:
    the addressing circuitry further comprises:
        a row decoder, and
        a column decoder;
    the memory device further comprises a voltage control switch; and
    the system further comprises control lines, address lines, and data lines coupled between the processor and the memory device.

7. The system of claim 1 wherein the gate is separated from the channel region by an insulating layer that is approximately between 50 angstroms and 100 angstroms thick.

8. The system of claim 7 wherein the insulating layer is approximately 100 angstroms thick.

9. An integrated circuit device comprising:
    a substrate;
    a p-channel transistor formed in a first portion of the substrate, the p-channel transistor including a source region, a drain region, a channel region between the source and drain regions, and an electrically interconnected silicon carbide gate over the channel region and separated therefrom by an insulating layer, the gate of the p-channel transistor comprising a silicon carbide compound $Si_{1-x}C_x$, wherein x is less than 0.5, and being connected to receive a first input signal; and
    an n-channel transistor formed in a second portion of the substrate, the n-channel transistor including a source region, a drain region, a channel region between the source and drain regions, and an electrically interconnected silicon carbide gate over the channel region and separated therefrom by an insulating layer, the gate of the n-channel transistor comprising a silicon carbide compound $Si_{1-x}C_x$, wherein x is less than 0.5, and being connected to receive a second input signal.

10. The integrated circuit device of claim 9, wherein the p-channel and n-channel silicon carbide gates comprise polycrystalline silicon carbide.

11. The integrated circuit device of claim 9, wherein the p-channel and n-channel silicon carbide gates comprise microcrystalline silicon carbide.

12. The integrated circuit device of claim 9, wherein the insulating layers, which separate the silicon carbide gates in each of the n-channel and p-channel transistors from their respective channel regions, are comprised of silicon dioxide.

13. The integrated circuit device of claim 9 wherein the substrate comprises a semiconductor surface layer formed on an underlying insulating portion.

14. A semiconductor memory device comprising:
    a memory array including a plurality of transistors, at least one of the transistors in a semiconductor surface layer formed on an underlying insulating portion and including an electrically interconnected gate formed of a silicon carbide compound $Si_{1-x}C_x$, wherein x is less than 0.5, the gate being connected to receive an input signal;

addressing circuitry to address the memory array; and control circuitry to control read, write, and erase operations of the memory device.

15. The semiconductor memory device of claim 14 wherein a plurality of the transistors in the memory array comprise:

a source region, a drain region, and a channel region between the source and drain regions in a semiconductor surface layer formed on an underlying insulating portion; and an electrically interconnected gate formed of a silicon carbide compound $Si_{1-x}C_x$, wherein x is less than 0.5, the gate being connected to receive an input signal.

16. The semiconductor memory device of claim 14 wherein pairs of the transistors in the memory array comprise:

a substrate;

a p-channel transistor formed in a first portion of the substrate, the p-channel transistor including a source region, a drain region, a channel region between the source and drain regions, and an electrically interconnected silicon carbide gate over the channel region and separated therefrom by an insulating layer, the gate of the p-channel transistor comprising a silicon carbide compound $Si_{1-x}C_x$, wherein x is less than 0.5, and being connected to receive a first input signal; and an n-channel transistor formed in a second portion of the substrate, the n-channel transistor including a source region, a drain region, a channel region between the source and drain regions, and an electrically interconnected silicon carbide gate over the channel region and separated therefrom by an insulating layer, the gate of the n-channel transistor comprising a silicon carbide compound $Si_{1-x}C_x$, wherein x is less than 0.5, and being connected to receive a second input signal.

17. The semiconductor memory device of claim 16 wherein the substrate comprises a semiconductor surface layer formed on an underlying insulating portion.

18. The semiconductor memory device of claim 14 wherein the silicon carbide compound $Si_{1-x}C_x$ comprises polycrystalline silicon carbide.

19. The semiconductor memory device of claim 14 wherein the silicon carbide compound $Si_{1-x}C_x$ comprises microcrystalline silicon carbide.

20. The semiconductor memory device of claim 14 wherein the gate is separated from the semiconductor surface layer by an insulating layer of silicon dioxide.

21. A semiconductor memory device comprising:

a memory array including a plurality of transistors wherein pairs of the transistors comprise:

a substrate;

a p-channel transistor formed in a first portion of the substrate, the p-channel transistor including a source region, a drain region, a channel region between the source and drain regions, and an electrically interconnected silicon carbide gate over the channel region and separated therefrom by an insulating layer, the gate of the p-channel transistor comprising a silicon carbide compound $Si_{1-x}C_x$, wherein x is less than 0.5, and being connected to receive a first input signal; and an n-channel transistor formed in a second portion of the substrate, the n-channel transistor including a source region, a drain region, a channel region between the source and drain regions, and an electrically interconnected silicon carbide gate over the channel region and separated therefrom by an insulating layer, the gate of the n-channel transistor comprising a silicon carbide compound $Si_{1-x}C_x$, wherein x is less than 0.5, and being connected to receive a second input signal;

addressing circuitry to address the memory array; and control circuitry to control read, write, and erase operations of the memory device.

22. The semiconductor memory device of claim 21 wherein the substrate comprises a semiconductor surface layer formed on an underlying insulating portion.

23. The semiconductor memory device of claim 21 wherein each silicon carbide gate comprises polycrystalline silicon carbide.

24. The semiconductor memory device of claim 21 wherein each silicon carbide gate comprises microcrystalline silicon carbide.

25. The semiconductor memory device of claim 21 wherein each insulating layer comprises silicon dioxide.

26. A memory device comprising:

an array of memory cells comprising a plurality of transistors, at least one of the transistors comprising:

a substrate having a source region, a drain region, and a channel region between the source region and the drain region formed in the substrate;

an insulating layer on the substrate over the channel region; and a gate comprising a p+ doped silicon carbide compound $Si_{1-x}C_x$ on the insulating layer, wherein x is less than 0.5, the gate being electrically interconnected to receive an input signal.

27. The memory device of claim 26 wherein:

the substrate comprises a silicon surface layer formed on an underlying insulating portion having a source region, a drain region, and a channel region between the source region and the drain region formed in the silicon surface layer;

the insulating layer comprises gate oxide or tunnel oxide;

the silicon carbide compound $Si_{1-x}C_x$ comprises polycrystalline silicon carbide or microcrystalline silicon carbide, or both polycrystalline and microcrystalline silicon carbide;

the silicon carbide compound $Si_{1-x}C_x$ is p+ doped with boron; and further comprising:

a row decoder coupled to the array;

a column decoder coupled to the array;

a voltage control switch; and control circuitry coupled to the array to control read, write, and erase operations of the memory device.

28. The memory device of claim 26 wherein:

the substrate comprises p-type silicon;

the source region comprises n-type silicon; and the drain region comprises n-type silicon.

29. The memory device of claim 26 wherein:

the substrate comprises n-type silicon;

the source region comprises p-type silicon; and the drain region comprises p-type silicon.

30. A memory device comprising:

an array of memory cells comprising a plurality of transistors, at least one of the transistors comprising:

a substrate having a source region, a drain region, and a channel region between the source region and the drain region formed in the substrate;

an insulating layer on the substrate over the channel region; and a gate comprising an n+ doped silicon carbide compound $Si_{1-x}C_x$ on the insulating layer, wherein x is less than 0.5, the gate being electrically interconnected to receive an input signal.

31. The memory device of claim 30 wherein:

the substrate comprises a silicon surface layer formed on an underlying insulating portion having a source region, a drain region, and a channel region between the source region and the drain region formed in the silicon surface layer;

the insulating layer comprises gate oxide or tunnel oxide;

the silicon carbide compound $Si_{1-x}C_x$ comprises polycrystalline silicon carbide or microcrystalline silicon carbide, or both polycrystalline and microcrystalline silicon carbide;

the silicon carbide compound $Si_{1-x}C_x$ is n+ doped with phosphorus; and further comprising:
a row decoder coupled to the array;
a column decoder coupled to the array;
a voltage control switch; and
control circuitry coupled to the array to control read, write, and erase operations of the memory device.

32. The memory device of claim 30 wherein:

the substrate comprises p-type silicon;

the source region comprises n-type silicon; and the drain region comprises n-type silicon.

33. The memory device of claim 30 wherein:

the substrate comprises n-type silicon;

the source region comprises p-type silicon; and the drain region comprises p-type silicon.

34. A memory device comprising:

an array of memory cells comprising a plurality of transistors, at least one of the transistors comprising:
  a source region, a drain region, and a channel region between the source region and the drain region formed in a semiconductor substrate;
  an insulating layer on the semiconductor substrate over the channel region; and
  a gate comprising a silicon carbide compound $Si_{1-x}C_x$ on the insulating layer wherein x is less than 0.5, the gate being electrically interconnected to receive an input signal.

35. The memory device of claim 34 wherein:

the semiconductor substrate comprises a p-type silicon surface layer formed on an underlying insulating portion;

the insulating layer comprises gate oxide or tunnel oxide;

the silicon carbide compound $Si_{1-x}C_x$ comprises polycrystalline silicon carbide or microcrystalline silicon carbide, or both polycrystalline and microcrystalline silicon carbide;

the source region comprises n-type silicon; and the drain region comprises n-type silicon.

36. The memory device of claim 34 wherein:

the semiconductor substrate comprises an n-type silicon surface layer formed on an underlying insulating portion;

the silicon carbide compound $Si_{1-x}C_x$ comprises polycrystalline silicon carbide or microcrystalline silicon carbide, or both polycrystalline and microcrystalline silicon carbide;

the insulating layer comprises gate oxide or tunnel oxide;

the source region comprises p-type silicon; and the drain region comprises p-type silicon.

37. The memory device of claim 34 wherein the silicon carbide compound $Si_{1-x}C_x$ is p+ doped with boron or n+ doped with phosphorus.

38. The memory device of claim 34, further comprising:

a row decoder coupled to the array;

column decoder coupled to the array;

a voltage control switch; and control circuitry coupled to the array to control read, write, and erase operations of the memory device.

39. A system comprising:

a processor; and a memory device coupled to the processor, the memory device comprising:
  an array of memory cells comprising a plurality of transistors, at least one of the transistors comprising:
    a source region, a drain region, and a channel region between the source region and the drain region formed in a semiconductor substrate;
    an insulating layer on the semiconductor substrate over the channel region; and
    a gate comprising a silicon carbide compound $Si_{1-x}C_x$ on the insulating layer wherein x is less than 0.5, the gate being electrically interconnected to receive an input signal.

40. The system of claim 39 wherein:

the semiconductor substrate comprises a p-type silicon surface layer formed on an underlying insulating portion;

the insulating layer comprises gate oxide or tunnel oxide;

the silicon carbide compound $Si_{1-x}C_x$ comprises polycrystalline silicon carbide or microcrystalline silicon carbide, or both polycrystalline and microcrystalline silicon carbide;

the source region comprises n-type silicon; and the drain region comprises n-type silicon.

41. The system of claim 39 wherein:

the semiconductor substrate comprises an n-type silicon surface layer formed on an underlying insulating portion;

the silicon carbide compound $Si_{1-x}C_x$ comprises polycrystalline silicon carbide or microcrystalline silicon carbide, or both polycrystalline and microcrystalline silicon carbide;

the insulating layer comprises gate oxide or tunnel oxide;

the source region comprises p-type silicon; and the drain region comprises p-type silicon.

42. The system of claim 39 wherein the silicon carbide compound $Si_{1-x}C_x$ is p+ doped with boron or n+ doped with phosphorus.

43. The system of claim 39 wherein:

the memory device further comprises:
  a row decoder coupled to the array;
  a column decoder coupled to the array;
  a voltage control switch; and
  control circuitry coupled to the array to control read, write, and erase operations of the memory device; and the system further comprises control lines, address lines, and data lines coupled between the processor and the memory device.

44. A system comprising:

a processor; and a memory device coupled to the processor through control lines, address lines, and data lines, the memory device comprising:

an array of memory cells comprising a plurality of transistors, each of the transistors comprising:

a source region, a drain region, and a channel region between the source region and the drain region formed in a semiconductor substrate;

an insulating layer on the semiconductor substrate over the channel region; and means for controlling current in the channel region based on an input signal, the means including a silicon carbide compound $Si_{1-x}C_x$ on the insulating layer wherein x is less than 0.5;

a row decoder coupled to the array;

a column decoder coupled to the array;

a voltage control switch; and control circuitry coupled to the array to control read, write, and erase operations of the memory device.

* * * * *

UNITED STATES PATENT AND TRADEMARK OFFICE
CERTIFICATE OF CORRECTION

PATENT NO. : 6,936,849 B1
DATED : August 30, 2005
INVENTOR(S) : Forbes et al.

Page 1 of 1

It is certified that error appears in the above-identified patent and that said Letters Patent is hereby corrected as shown below:

Title page,
Item [56], References Cited, OTHER PUBLICATIONS,
"Wu" reference, delete "3636" and insert -- 3836 --.

Column 5,
Line 56, delete "ptype" and insert -- p-type --.

Column 6,
Line 13, delete "SNEW" and insert -- NEW --.

Column 7,
Line 1, delete "thought" and insert -- though --.

Column 10,
Line 13, after "row decoder" delete "," and insert -- ; --.

Column 13,
Line 64, after "$Si_{1-x}C_x$" delete ",".

Column 14,
Line 10, insert -- a -- before "column".

Signed and Sealed this

Seventh Day of February, 2006

JON W. DUDAS
*Director of the United States Patent and Trademark Office*